(12) United States Patent
Balakrishnan et al.

(10) Patent No.: US 10,079,288 B2
(45) Date of Patent: Sep. 18, 2018

(54) CONTACT FORMATION ON GERMANIUM-CONTAINING SUBSTRATES USING HYDROGENATED SILICON

(71) Applicant: International Business Machines Corporation, Armonk, NY (US)

(72) Inventors: Karthik Balakrishnan, White Plains, NY (US); Pouya Hashemi, White Plains, NY (US); Bahman Hekmatshoartabari, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 15/175,694

(22) Filed: Jun. 7, 2016

(65) Prior Publication Data

US 2017/0352738 A1 Dec. 7, 2017

(51) Int. Cl.

| | |
|---|---|
| *H01L 29/49* | (2006.01) |
| *H01L 29/40* | (2006.01) |
| *H01L 29/16* | (2006.01) |
| *H01L 29/24* | (2006.01) |
| *H01L 21/30* | (2006.01) |
| *H01L 21/02* | (2006.01) |
| *H01L 21/28* | (2006.01) |
| *H01L 21/3065* | (2006.01) |

(52) U.S. Cl.
CPC .... *H01L 29/4941* (2013.01); *H01L 21/02271* (2013.01); *H01L 21/02592* (2013.01); *H01L 21/28097* (2013.01); *H01L 21/3003* (2013.01); *H01L 21/3065* (2013.01); *H01L 29/16* (2013.01); *H01L 29/24* (2013.01); *H01L 29/401* (2013.01)

(58) Field of Classification Search
CPC ......... H01L 29/49; H01L 29/24; H01L 29/40; H01L 29/16; H01L 29/4941
See application file for complete search history.

(56) References Cited

U.S. PATENT DOCUMENTS

| | | | |
|---|---|---|---|
| 2004/0192026 A1* | 9/2004 | Chen ................. | H01L 21/76802 438/629 |
| 2012/0168877 A1* | 7/2012 | Mukherjee ........ | H01L 21/28575 257/401 |

(Continued)

*Primary Examiner* — Marc Armand
*Assistant Examiner* — Quinton Brasfield
(74) *Attorney, Agent, or Firm* — Scully, Scott, Murphy & Presser, P.C.; Louis J. Percello, Esq.

(57) ABSTRACT

A method and structure is provided in which germanium or a germanium tin alloy can be used as a channel material in either planar or non-planar architectures, with a functional gate structure formed utilizing either a gate first or gate last process. After formation of the functional gate structure, and contact openings within a middle-of-the-line (MOL) dielectric material, a hydrogenated silicon layer is formed that includes hydrogenated crystalline silicon regions disposed over the germanium or a germanium tin alloy, and hydrogenated amorphous silicon regions disposed over dielectric material. The hydrogenated amorphous silicon regions can be removed selective to the hydrogenated crystalline silicon regions, and thereafter a contact structure is formed on the hydrogenated crystalline silicon regions.

12 Claims, 3 Drawing Sheets

(56) References Cited

U.S. PATENT DOCUMENTS

| | | |
|---|---|---|
| 2012/0210932 A1 | 8/2012 | Hekmatshoar-Tabari et al. |
| 2012/0231596 A1* | 9/2012 | Majhi ............... H01L 21/28518 |
| | | 438/285 |
| 2013/0307075 A1 | 11/2013 | Hekmatshoar-Tabari et al. |
| 2013/0320417 A1* | 12/2013 | Mukherjee ............ H01L 29/401 |
| | | 257/288 |
| 2014/0197376 A1* | 7/2014 | Ma ........................ H01L 29/775 |
| | | 257/24 |
| 2014/0346567 A1* | 11/2014 | Basu ................ H01L 29/66462 |
| | | 257/194 |

* cited by examiner

CONTACT FORMATION ON GERMANIUM-CONTAINING SUBSTRATES USING HYDROGENATED SILICON

BACKGROUND

The present application relates to a semiconductor structure and a method of forming the same. More particularly, the present application relates to a semiconductor structure in which a hydrogenated crystalline silicon region is disposed between a channel material of germanium or a germanium tin alloy and a contact structure, and a method of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

Germanium and germanium tin alloys are examples of high carrier mobility channel materials which are attractive for use in complementary metal oxide semiconductor (CMOS) logic devices at the 7 nm and beyond technology nodes. These materials require low processing temperatures due to material instability. Moreover, forming contact structures on n-doped germanium is a well known problem due to low density of the dopants and high contact resistance. There is thus a need for providing a method of forming a semiconductor structure including a channel material of germanium or a germanium tin alloy and a contact structure that circumvents the problems mentioned above.

SUMMARY

In the present application, a method and structure is provided in which germanium or a germanium tin alloy can be used as a channel material in either planar or non-planar (Fin or semiconductor nanowire) architectures, with a functional gate structure formed utilizing either a gate first or gate last process. In the present application, and after formation of the functional gate structure, and contact openings within a middle-of-the-line (MOL) dielectric material, a hydrogenated silicon layer is formed that includes hydrogenated crystalline silicon regions disposed over the germanium or a germanium tin alloy, and hydrogenated amorphous silicon regions disposed over dielectric material. The hydrogenated amorphous silicon regions can be removed selective to the hydrogenated crystalline silicon regions, and thereafter a contact structure is formed on the hydrogenated crystalline silicon regions.

In one aspect of the present application, a semiconductor structure is provided. In one embodiment of the present application, the semiconductor structure may include a functional gate structure located on a channel material layer composed of germanium or a germanium tin alloy. A middle-of-the-line dielectric material surrounds the functional gate structure and has a topmost surface that is coplanar with a topmost surface of the functional gate structure. The middle-of-line dielectric material further comprises contact openings located on both sides of the functional gate structure. A hydrogenated crystalline silicon region is located on an exposed surface of the channel material layer and in each contact opening, and a contact structure is located on a surface of the hydrogenated crystalline silicon region and in each contact opening. The contact structure comprises a metal silicide located on the hydrogenated crystalline silicon region and a contact metal located on the metal silicide.

In another aspect of the present application, a method of forming a semiconductor structure is provided. In one embodiment of the present application, the method may include providing a structure containing a functional gate structure located on a surface of a channel material composed of germanium or a germanium tin alloy, the functional gate structure is surrounded by a middle-of-the-line dielectric material. The middle-of-the-line dielectric material has a topmost surface that is coplanar with a topmost surface of the functional gate structure. Next, a contact opening is formed in the middle-of-the-line dielectric material and on each side of the functional gate structure. A hydrogenated silicon layer comprising hydrogenated crystalline silicon regions and hydrogenated amorphous silicon regions is then formed in at least each of the contact openings, wherein the hydrogenated crystalline silicon regions are disposed on the channel material and the amorphous silicon hydrogenated material are disposed on exposed surfaces of at least the middle-of-the-line dielectric material. Next, the hydrogenated amorphous silicon regions of the hydrogenated silicon layer are removed, and thereafter a contact structure is formed in each contact opening and on a surface of the hydrogenated crystalline silicon regions. The contact structure comprises a metal silicide located on the hydrogenated crystalline silicon region and a contact metal located on the metal silicide.

DETAILED DESCRIPTION

Figure 1:
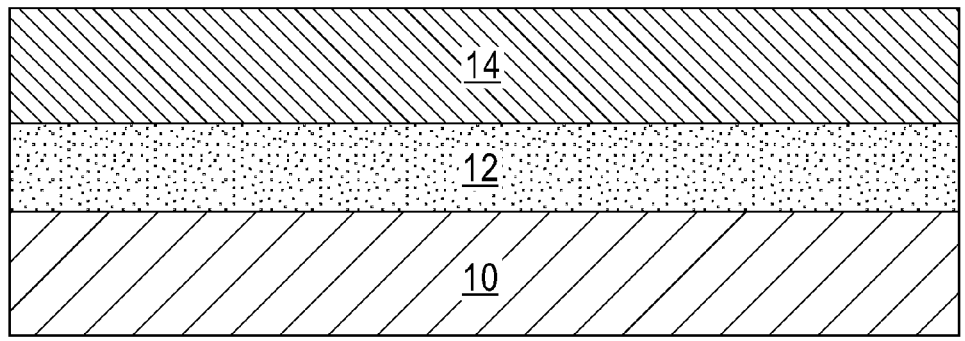
FIG. 1 is a cross sectional view of an exemplary semiconductor structure including a germanium-containing substrate of, from bottom to top, a handle substrate, an insulator layer, and a topmost layer of germanium (Ge) or a germanium tin (GeSn) alloy that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a germanium-containing substrate of, from bottom to top, a handle substrate 10, an insulator layer 12, and a topmost layer 14 of germanium (Ge) or a germanium tin (GeSn) alloy that can be employed in accordance with an embodiment of the present application. The handle substrate 10 provides mechanical support for the insulator layer 12 and the topmost layer 14 of germanium (Ge) or a germanium tin (GeSn) alloy. In one embodiment, the topmost layer 14 is composed of germanium. In another embodiment, the topmost layer 14 is composed of a germanium tin alloy. In one embodiment, and when a germanium tin alloy is used as the topmost layer 14, the tin content of the germanium tin alloy may be in a range from 0.1 atomic percent to 10 atomic percent, the remaining content of the germanium tin alloy, up to 100 atomic percent, is composed of germanium. In the present application, a portion of the topmost layer 14 will subsequently be used as a channel region of a semiconductor device.

In one embodiment, the handle substrate 10 may comprise any semiconductor material having semiconductor properties. Examples of semiconductor materials that may be used as the handle substrate 10 include, but are not limited to, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate 10. In some embodiments, the semiconductor material that provides the handle substrate 10 may have any crystal orientation known to those skilled in the art including, for example, {100}, {110}, or {111}. The handle substrate 10 may be a single crystalline semiconductor material, a polycrystalline material, or an amorphous material.

In some embodiments, the handle substrate 10 is a non-semiconductor material including, for example, a dielectric material and/or a conductive material. In yet other embodiments, the handle substrate 10 can be omitted and a substrate including the insulator layer 12 and the topmost layer 14 can be used.

The insulator layer 12, which in some embodiments may be referred to as a buried insulator layer, may be a crystalline, or non-crystalline, oxide or nitride. In one embodiment, the insulator layer 12 is an oxide such as, for example, silicon dioxide.

In some embodiments of the present application, the topmost layer 14 can have a thickness from 10 nm to 100 nm. In yet other embodiments, the topmost layer 14 can have a thickness that is less than 10 nm. The insulator layer 12 may have a thickness from 1 nm to 200 nm. Other thicknesses that are lesser than, or greater than, the aforementioned thickness range can also be employed as the insulator layer 12. The thickness of the handle substrate 10 is inconsequential to the present application.

The germanium-containing substrate shown in FIG. 1 can be formed utilizing a layer transfer process. The layer transfer process may include bonding a first wafer containing the handle substrate 10 and the insulator layer 12 to a second wafer containing the topmost layer 14. In some embodiments, and after wafer bonding, an optional thinning step may be performed to thin the topmost layer 14 to a predetermined thickness that is more desirable for certain device applications, and within one of the ranges mentioned above.

Although not shown, the present application may be performed in which a bulk substrate composed entirely of germanium or a germanium tin alloy can be employed as the germanium-containing substrate instead of the germanium-containing substrate shown in FIG. 1. In such an embodiment, the germanium-containing substrate does not include both of the handle substrate 10 and the insulator layer 12.

In some embodiments, at least an uppermost portion of the topmost layer 14 of the germanium-containing substrate (bulk or non-bulk) can be processed to including at least one fin structure and/or nanowire structure utilizing techniques that are well known to those skilled in the art. For example, the topmost layer 14 can be formed into at least one fin structure by patterning at least an uppermost portion of the topmost layer utilizing a patterning technique such as, for example, lithography and etching, a sidewall image transfer process, or a direct self-assembly process. Nanowire structures can be formed by patterning the topmost layer 14 to include nanowire structures of germanium or a germanium tin alloy attached to pad regions of germanium or a germanium tin alloy and thereafter, and in some embodiments, material present beneath each nanowire structure can be removed to provide suspended nanowire structures. When fin and semiconductor nanowire structures are formed, the processing flow described below can be generally applied to those structures.

Figure 2:
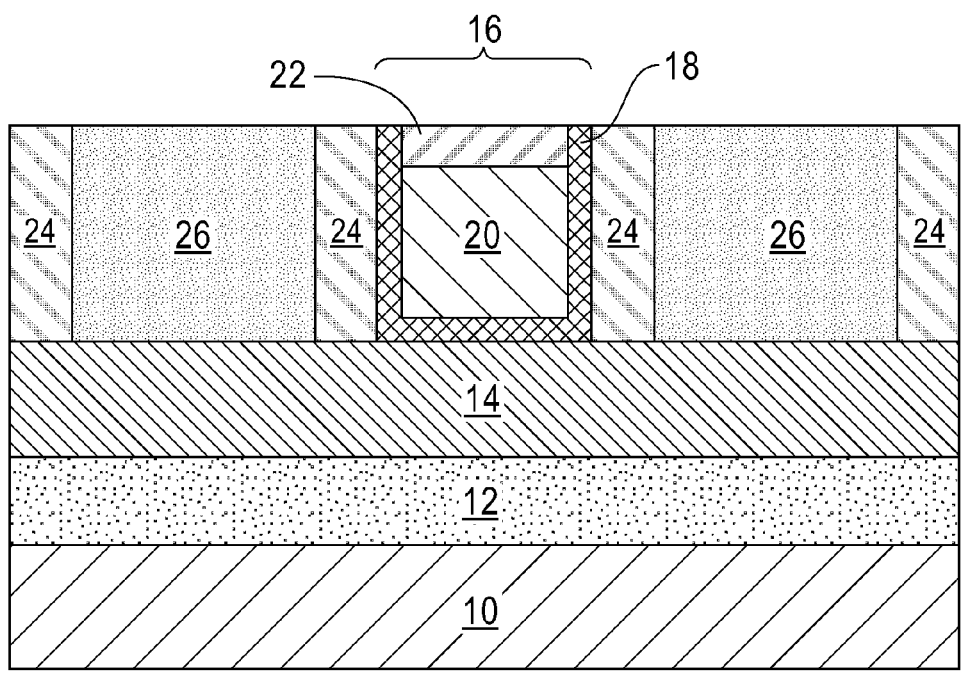
FIG. 2 is a cross sectional view of the exemplary semiconductor structure of FIG. 1 after formation of a functional gate structure, gate spacer, and a middle-of-the-line (MOL) dielectric material.

Referring now to FIG. 2, there is illustrated the exemplary semiconductor structure of FIG. 1 after formation of a functional gate structure 16, gate spacer 24, and a middle-of-the-line (MOL) dielectric material 26. By "functional gate structure" it is meant a permanent gate structure used to control output current (i.e., flow of carriers in the channel) of a semiconducting device through electrical or magnetic fields. Although the present application describes and illustrates the formation of a single functional gate structure 16, a plurality of functional gate structures can be formed; in the present application, one additional functional gate structure would be located on the far left hand side of the drawing, while another additional functional gate structure would be located on the far right hand side of the drawing.

The functional gate structure 16 may be formed utilizing a gate first process, or a gate last process. In a gate first process, the functional gate structure 16 is formed prior to forming the gate spacer 24, the MOL dielectric material 26 and source/drain regions (not shown). In a gate last process, the functional gate structure is formed after formation of the gate spacer 24, the MOL dielectric material 26 and source/drain regions (not shown). In such a process, a sacrificial gate structure is first provided, and after gate spacer formation, MOL dielectric material formation and source/drain regions formation, the sacrificial gate structure is replaced with a functional gate structure 16. By sacrificial gate structure" it is meant a material or material stack that serves as a placeholder for a subsequently formed functional gate structure. In such a process, the functional gate structure is formed after the source/drain structures have been formed. In either embodiment, the functional gate structure includes a gate stack of a gate dielectric portion 18, a gate conductor portion 20, and a gate cap portion 22.

The gate dielectric portion 18 is composed of a gate dielectric material. The gate dielectric material that provides the gate dielectric portion 18 can be an oxide, nitride, and/or oxynitride. In one example, the gate dielectric material that provides the gate dielectric portion 18 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion 18. When a plurality of functional gate structures is formed, each functional gate structure may include a same or different gate dielectric material. Typically, the gate dielectric portion 18 does not include a hydrogenated non-crystalline semiconductor material and/or a hydrogenated non-crystalline silicon nitride portion as one of the gate dielectric materials.

The gate dielectric material used in providing the gate dielectric portion 18 can be formed by any deposition process including, for example, chemical vapor deposition (CVD), plasma enhanced chemical vapor deposition (PECVD), physical vapor deposition (PVD), sputtering, or atomic layer deposition. When a different gate dielectric material is used for the gate dielectric portions of different functional gate structures, block mask technology can be used. In one embodiment of the present application, the gate dielectric material used in providing the gate dielectric portion 18 can have a thickness in a range from 1 nm to 10 nm. Other thicknesses that are lesser than, or greater than, the aforementioned thickness range can also be employed for the gate dielectric material.

The gate conductor portion 20 is composed of a gate conductor material. The gate conductor material used in providing the gate conductor portion 20 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 20 may comprise an nFET gate metal or a pFET gate metal. When a plurality of functional gate structures is formed, each functional gate structure may include a same or different gate conductor material.

The gate conductor material used in providing the gate conductor portion 20 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used in forming different functional gate structures, block mask technology can be used. In one embodiment, the gate conductor material used in providing the gate conductor portion 20 has a thickness from 1 nm to 100 nm. Other thicknesses that are lesser than, or greater than, the aforementioned thickness range can also be employed for the gate conductor material used in providing the gate conductor portion 20.

The gate cap portion 22 comprises a gate cap material. The gate cap material that provides the gate cap portion 22 may include an oxide, nitride and/or oxynitride. In one embodiment, the gate cap portion 22 comprises silicon dioxide, silicon nitride, and/or silicon oxynitride. The dielectric material that provides the gate cap portion 22 can be formed utilizing a conventional deposition process such as, for example, chemical vapor deposition or plasma enhanced chemical vapor deposition. The dielectric material that provides the gate cap portion 22 can have a thickness from 5 nm to 20 nm. Other thicknesses that are lesser than, or greater than, the aforementioned thickness range can also be employed as the thickness of the dielectric material that provides gate cap portion 22.

In one embodiment and in a gate first process (not specifically shown), the functional gate structure 16 can be formed by providing a functional gate material stack of, from bottom to top, the gate dielectric material, the gate conductor material and, the gate cap material. The functional gate material stack can then be patterned. In one embodiment of the present application, patterning of the functional gate material stack may be performed utilizing lithography and etching. In another embodiment and in a gate last process, the functional gate structure 16 can be formed by providing a functional gate material stack of, from bottom to top, the gate dielectric material, the gate conductor material and, the gate cap material. The functional gate material stack can then be planarized. In yet another embodiment and in a gate last process, the functional gate structure 16 can be formed by providing a functional gate material stack of, from bottom to top, the gate dielectric material, and the gate conductor material. The functional gate material stack can then be planarized. A recess etch may then be performed, and thereafter the gate cap material can be formed in the recessed area.

When a gate last process is employed, the gate dielectric portion 18 of the replacement functional gate structure 16 may be U-shaped; such an embodiment is illustrated in FIG. 2. By "U-shaped" it is meant a material that includes a bottom horizontal surface and a sidewall surface that extends upward from the bottom horizontal surface. It is noted that the present application is not limited to functional gate structures as illustrated in the drawings. For example, the present application can be employed when the gate dielectric portion of the functional gate structure is located entirely beneath the gate conductor portion.

The gate spacer 24 can be formed by first providing a spacer material and then etching the spacer material. In some embodiments, the gate spacer 24 can be formed on exposed sidewalls of the functional gate structure (typical when a gate first process is used). In embodiments when a gate last process is employed, the gate spacer 24 is formed on the exposed sidewalls of the sacrificial gate structure. The spacer material may be composed of any dielectric spacer material including, for example, a dielectric oxide, dielectric nitride, and/or dielectric oxynitride. In one example, the spacer material used in providing the gate spacer 24 may be composed of silicon dioxide or silicon nitride. The spacer material can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

The MOL dielectric material 26 which may be formed prior to, or after formation of the functional gate structure 16, may comprise any dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric material 26. The use of a self-planarizing dielectric material as MOL dielectric material 26 may avoid the need to perform a subsequent planarizing step.

In one embodiment, the MOL dielectric material 26 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the MOL dielectric material 26, a planarization process or an etch back process follows the deposition of the MOL dielectric material 26. The thickness of the MOL dielectric material 26 that can be employed in the present application may vary depending on the type of dielectric material employed as well as the method that was employed in forming the same. The MOL dielectric material 26 has a topmost surface that is coplanar with a topmost surface of the functional gate structure 16 as well as the topmost surface of the gate spacer 24. In the embodiment of the present application illustrated in the drawings, the MOL dielectric material 26 has a topmost surface that is coplanar with a topmost surface of the gate dielectric portion 18 and the gate cap portion 22.

Although not shown in the drawings, the source/drain regions are formed into portions of the topmost layer 14 that are not protected by at least the functional gate structure and gate spacer. The source/drain regions can be formed by ion implantation or gas phase doping. The source/drain regions contain a p-type or n-type dopant. The term "p-type" refers to the addition of impurities to an intrinsic semiconductor that creates deficiencies of valence electrons. "N-type" refers to the addition of impurities that contributes free electrons to an intrinsic semiconductor. The concentration of dopants within the source/drain regions can be within ranges typically used in forming metal oxide semiconductor field effect transistors (MOSFETs).

Figure 3:
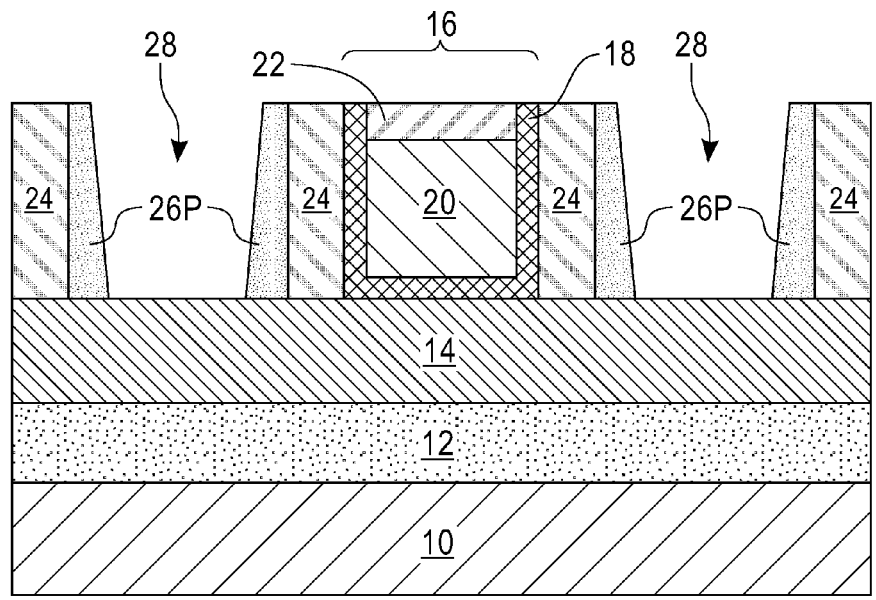
FIG. 3 is a cross sectional view of the exemplary semiconductor structure of FIG. 2 after forming a contact opening in the MOL dielectric material and on each side of the functional gate structure.

Referring now to FIG. 3, there is illustrated the exemplary semiconductor structure of FIG. 2 after forming a contact opening 28 in the MOL dielectric material 26 and on each side of the functional gate structure 16. Each contact opening 28 exposes a portion of the topmost layer 14 in which the source/drain regions would be present. Each contact opening 28 is thus formed entirely through the MOL dielectric material 26. Each contact opening 28 can be formed by lithography and etching. In one embodiment, and as shown in FIG. 3, the sidewalls of the remaining MOL dielectric material (i.e., MOL dielectric material portions 26P) within each contact opening 28 are slanted with respect to the topmost horizontal surface of the topmost layer 14. In other embodiments of the present application (not shown), sidewalls of the remaining MOL dielectric material (i.e., MOL dielectric material portions 26P) within each contact opening 28 are vertical with respect to the topmost horizontal surface of the topmost layer 14.

Figure 4:
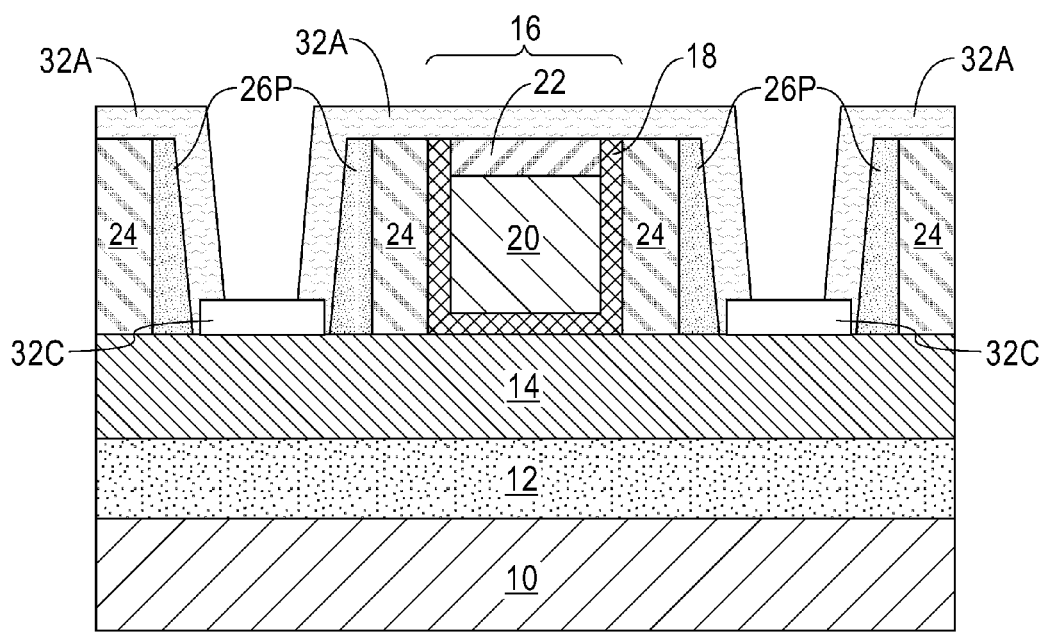
FIG. 4 is a cross sectional view of the exemplary semiconductor structure of FIG. 3 after forming a hydrogenated silicon layer that includes hydrogenated crystalline silicon regions and hydrogenated amorphous silicon regions.

Referring now to FIG. 4, there is illustrated the exemplary semiconductor structure of FIG. 3 after forming a hydrogenated silicon layer that includes hydrogenated crystalline silicon regions 32C and hydrogenated amorphous silicon regions 32A. The hydrogenated silicon layer is a continuous layer meaning that there are no breaks between the hydrogenated crystalline silicon regions 32C and hydrogenated amorphous silicon regions 32A.

As is shown, each hydrogenated crystalline silicon regions 32C is formed on an exposed surface of the topmost layer 14, while each hydrogenated amorphous silicon region 32A is formed on exposed dielectric material surfaces, i.e., sidewall and topmost surfaces of each ILD material portion 26P, a topmost surface of each gate spacer 24, and a topmost surface of the gate dielectric material portion 18 and the gate cap portion 22. Each hydrogenated crystalline silicon region 32C is separated from a sidewall surface of the gate spacer 24 by a portion of one of the MOL dielectric material portions 26P, and each hydrogenated crystalline silicon region 32C is separated from the various components of the functional gate structure 16 by both the gate spacer 24 and one of the MOL dielectric material portions 26P.

Each hydrogenated crystalline silicon region 32C includes silicon that contains a well defined crystal structure, i.e., single crystalline silicon, and hydrogen, while each hydrogenated amorphous silicon region 32 include silicon that lacks a well defined crystal structure, and hydrogen. Each of the hydrogenated crystalline silicon regions 32C and hydrogenated amorphous silicon regions 32A may be doped within an n-type dopant or a p-type dopant. Each of the hydrogenated crystalline silicon regions 32C and hydrogenated amorphous silicon regions 32A may further include one element selected from the group consisting of deuterium, fluorine, chlorine, carbon, germanium, oxygen and nitrogen.

The hydrogenated silicon layer that includes hydrogenated crystalline silicon regions 32C and hydrogenated amorphous silicon regions 32A may be formed utilizing a selective epitaxial growth process. In one embodiment of the present application, the selective epitaxial growth of the hydrogenated silicon layer that includes hydrogenated crystalline silicon regions 32C and hydrogenated amorphous silicon regions 32A may include plasma enhanced chemical vapor deposition (PECVD) that is performed at a deposition temperature from 20° C. (i.e., room temperature) to 450° C. (in some embodiments the deposition temperature is within a range from 150° C. to 250° C.) and using a gas mixture that comprises a silicon-containing precursor, such as, for example, a silane, and hydrogen as a carrier gas. Within the gas mixture used to provide the hydrogenated silicon layer, the ratio of hydrogen to silicon-containing precursor is greater than 5. In some embodiments, the ratio of hydrogen to silicon-containing precursor is from 7 to 10. In addition to silane (i.e., $SiH_4$), other gases of the $Si_xH_y$ family wherein x is at least 2, and y is 2x can used.

In some embodiments of the present application, the gas mixture used to provide the hydrogenated silicon layer may further include an n-type or a p-type dopant that is provided by a corresponding dopant source gas. In a silicon-containing material, examples of p-type dopants, i.e., impurities, include, but are not limited to, boron, aluminum, gallium and indium. In one example, $B_2H_6$ or tetramethylboron can be used as a dopant source gas for providing boron to the hydrogenated silicon layer. In a silicon containing material, examples of n-type dopants, i.e., impurities, include, but are not limited to, antimony, arsenic and phosphorous. In one example, $PH_3$ can be used as a dopant source gas for providing phosphorus to the hydrogenated silicon layer.

The gas mixture used to provide the hydrogenated silicon layer may further include gases that include deuterium, fluorine, chlorine, carbon, germanium, oxygen and nitrogen.

In some embodiments of the present application, a hot-wire chemical vapor deposition (HWCVD) process can be used to form the hydrogenated silicon layer. The HWCVD process may include the use of a hot wire to crack gas molecules (in the PECVD process mentioned above a plasma is used to crack the gas molecules). The HWCVD process includes the use a gas mixture similar to those mentioned above for the PECVD process. The HWCVD is performed at a temperature sufficient to cause gas cracking; the temperature is typically determined by the type of silicon-containing precursor employed in the present application.

The hydrogenated silicon layer including the hydrogenated crystalline silicon regions 32C and hydrogenated amorphous silicon regions 32A may include hydrogen in a content of from 5 atomic to 40 atomic percent. In some embodiments, the hydrogen content within the hydrogenated silicon layer including the hydrogenated crystalline silicon regions 32C and hydrogenated amorphous silicon regions 32A is uniform. In other embodiments, the hydrogen content within the hydrogenated silicon layer including the hydrogenated crystalline silicon regions 32C and hydrogenated amorphous silicon regions 32A is non-uniform (i.e., graded). In one example, the hydrogen content within the hydrogenated silicon layer including the hydrogenated crystalline silicon regions 32C and hydrogenated amorphous silicon regions 32A increases upward from a bottommost surface to a topmost surface. In yet another embodiment, the hydrogen content within the hydrogenated silicon layer including the hydrogenated crystalline silicon regions 32C and hydrogenated amorphous silicon regions 32A decreases upward from a bottommost surface to a topmost surface.

In some embodiments, the hydrogenated silicon layer including the hydrogenated crystalline silicon regions 32C and hydrogenated amorphous silicon regions 32A may include an n-type or p-type dopant within a total dopant concentration from $2\times10^{20}$ atoms/cm$^3$ to $2\times10^{21}$ atoms/cm$^3$ and an active dopant concentration from $5\times10^{18}$ atoms/cm$^3$ to $2\times10^{20}$ atoms/cm$^3$. In some embodiments, the hydrogenated silicon layer including the hydrogenated crystalline silicon regions 32C and hydrogenated amorphous silicon regions 32A includes at least one element selected from deuterium, fluorine, chlorine, carbon, germanium, oxygen and nitrogen in a concentration from $10^{16}$ atoms/cm$^3$ to $10^{22}$ atoms/cm$^3$.

Figure 5:
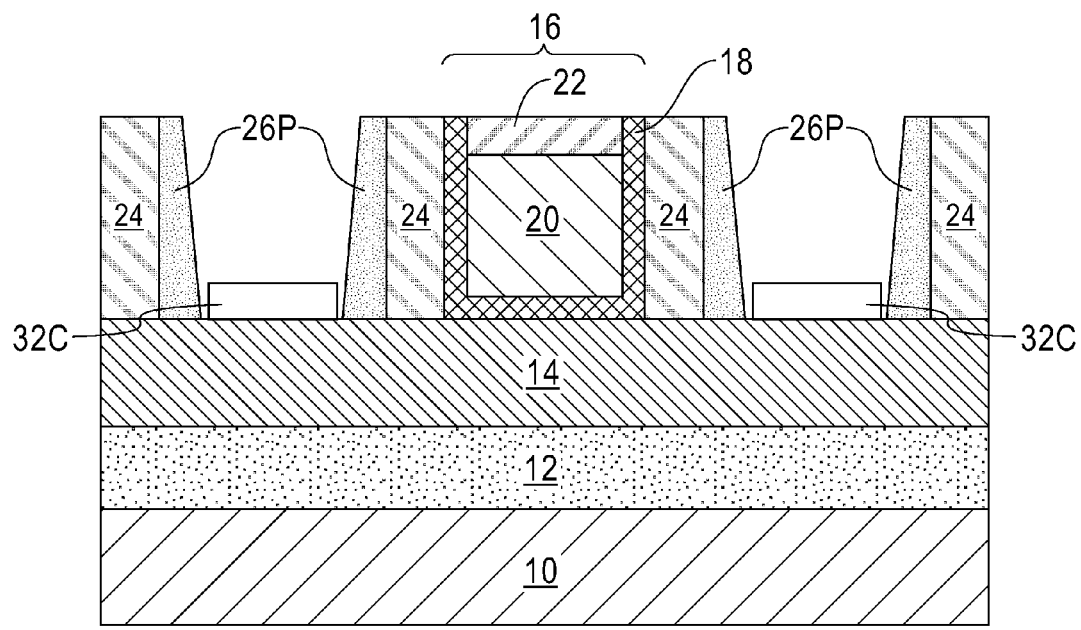
FIG. 5 is a cross sectional view of the exemplary semiconductor structure of FIG. 4 after removing the hydrogenated amorphous silicon regions of the hydrogenated silicon layer.

Referring now to FIG. 5, there is illustrated the exemplary semiconductor structure of FIG. 4 after removing the hydrogenated amorphous silicon regions 32A of the hydrogenated silicon layer. The hydrogenated amorphous silicon regions 32A can be removed utilizing an etch that is selective in removing hydrogenated amorphous silicon relative to hydrogenated crystalline silicon. In one embodiment of the present application, the etch used to remove the hydrogenated amorphous silicon regions 32A has an etch selectivity in a range from 3:1 to 10:1. The etch used to remove the hydrogenated amorphous silicon regions 32A may include a hydrogen plasma, dilute KOH (i.e., 1M or below concentration) or dilute HF (less than 5% in deionized water).

Figure 6:
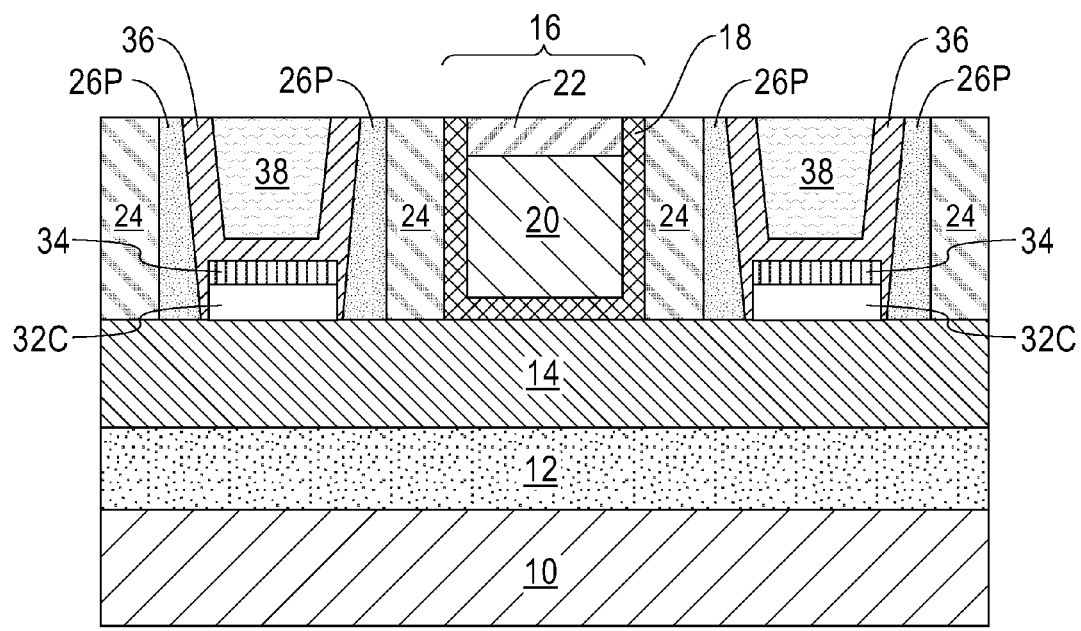
FIG. 6 is a cross sectional view of the exemplary semiconductor structure of FIG. 5 after formation of a contact structure in each opening and on a surface of the hydrogenated crystalline silicon regions.

Referring now to FIG. 6, there is illustrated the exemplary semiconductor structure of FIG. 5 after formation of a contact structure in each contact opening 28 and on a surface of the hydrogenated crystalline silicon regions 32C. Each contact structure may include a metal silicide 34, a diffusion barrier liner 36, and a contact metal 38. In some embodiment, the diffusion barrier liner 36 may be omitted. In some embodiments, of the present application, and when the diffusion barrier liner 36 is present, a portion of the diffusion barrier liner 36 may be in direct physical contact with each sidewall of the hydrogenated crystalline silicon region 32C. As is shown, the metal silicide 34 is formed on the entire topmost surface of the hydrogenated crystalline silicon regions 32C that is present in each contact opening 28.

The metal silicide 34 can be formed by first depositing a metal semiconductor alloy forming metal (not shown) such as for example, Ni, Pt, Co, and alloys such as NiPt, on the structure shown in FIG. 5; the metal semiconductor alloy forming metal has a portion located within each contact opening 28 that is located on a topmost surface of each hydrogenated crystalline silicon region 32C. The metal semiconductor alloy forming metal that provides the metal silicide 34 can be formed by a conformal deposition process. A diffusion barrier layer such as, for example, TiN or TaN, can be deposited atop the metal semiconductor alloy forming metal. An anneal is then performed that causes reaction between the metal semiconductor alloy forming metal and an underlying portion of the hydrogenated crystalline silicon region 32C within each contact opening 28. The anneal may be performed at a temperature from 300° C. to 700° C. Other annealing temperatures that are lesser than, or greater than, the aforementioned temperature range can be employed so long as the selected temperature is capable of forming the metal silicide 34. After annealing, any unreactive metal semiconductor alloy forming metal and, if present, the first diffusion barrier layer can be removed. When Ni is used, the NiSi phase is formed due to its low resistivity. For example, formation temperatures of NiSi may include 400° C.-600° C.

The anneal time for the formation of the metal silicide 34 is chosen such that the loss of hydrogen from the hydrogenated crystalline silicon regions 32C by out-diffusion during the annealing is minimized. In one example, 50% of the hydrogen content of the hydrogenated crystalline silicon regions 32C is lost during an annealing time of approximately 25 hours at an annealing temperature of 350° C., therefore the annealing time is limited to 2-3 hours, which is sufficient for silicide formation, but longer anneal times may be used as well, in other examples. In another example, 50% of the hydrogen content of the hydrogenated crystalline silicon regions 32C is lost during an annealing time of approximately 30 minutes at an annealing temperature of 500° C., therefore the annealing time is limited to 30 minutes. In yet another example, 50% of the hydrogen content of the hydrogenated crystalline silicon regions 32C is lost during an annealing time of approximately 5 minutes at an annealing temperature of 600° C., therefore the annealing time is limited to 5 minutes. The loss of hydrogen in the hydrogenated crystalline silicon regions 32C results in the formation of defects and therefore the loss of free carriers provided by dopants. In some embodiments, to the first order, the loss of one hydrogen atom results in the formation one dangling bond, in turn trapping one free charge carrier.

In accordance with the present application, each metal silicide 34 that is formed includes a metal semiconductor alloy forming metal and silicon from the hydrogenated crystalline silicon regions 32C. The thickness of the metal silicide 34 may range from 2 nm to 50 nm. Other thicknesses that are lesser than, or greater than, the aforementioned thickness range can also be provided for the metal silicide 34.

After metal silicide 34 formation, a diffusion barrier material which is used to provide the diffusion barrier liner 36 can be formed within each contact opening 28 prior to forming the conductive metal that provides the contact metal 38. When present, the diffusion barrier material may include Co, CoN, Ir, Pt, Pd, Ta, TaN, Ti, TiN, Ru, RuN, RuTa, RuTaN, W or WN. The diffusion barrier material may be formed utilizing any known deposition process including, for example, chemical vapor deposition or plasma enhanced chemical vapor deposition. When present, the diffusion barrier material can have a thickness 1 nm to 50 nm. Other thicknesses that are lesser than, or greater than, the aforementioned thickness range may also be employed for the optional diffusion barrier material.

The conductive metal is then formed into the remaining volume of each contact opening 28. The conductive metal that provides the contact metal 38 may include, for example, copper, aluminum, tungsten, ruthenium, cobalt or alloys thereof. In some embodiments, a single conductive metal is used to provide the contact metal 38. In yet other embodiments, each contact metal 38 may comprise at least two different conductive metals stacked one atop the other. The conductive metal that provides each contact metal 38 can be formed by a deposition process such as, for example, chemical vapor deposition, plasma enhanced chemical vapor deposition, plating, or physical vapor deposition. Following the deposition of the conductive metal, a planarization process such as, for example, chemical mechanical polishing and/or grinding may be employed to provide the contact metal 38 shown in FIG. 6. During this planarization process, a portion of the diffusion barrier material that is present outside each contact opening 28 is removed to provide the diffusion barrier liner 36 shown in FIG. 6. In the present application, the topmost surface of the contact metal 38 and the topmost surface of the diffusion barrier liner 26, if present, are coplanar with a topmost surface of each of the functional gate structure 16, the gate spacer 24 and the MOL dielectric material portions 26P. In some embodiments, and as shown, the topmost surface of the gate dielectric portion 18 of the functional gate structure 16 is coplanar with a topmost surfaces of the contact metal 38 and, if present, the topmost surface of the diffusion barrier liner 36.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a functional gate structure located on a channel material composed of germanium or a germanium tin alloy;
   a middle-of-the-line dielectric material surrounding said functional gate structure and having a topmost surface that is coplanar with a topmost surface of said functional gate structure, said middle-of-line dielectric material comprises contact openings located on both sides of said functional gate structure;
   a hydrogenated crystalline silicon region located on an exposed surface of said channel material layer and contained entirely in each contact opening; and
   a contact structure located on a surface of said hydrogenated crystalline silicon region and in each contact opening, wherein said contact structure comprises a metal silicide located on a topmost surface of said hydrogenated crystalline silicon region and a contact metal located on said metal silicide, wherein a diffusion barrier liner composed of a metal or metal nitride is positioned between said metal silicide and said contact metal and is in direct physical contact with sidewalls of said hydrogenated crystalline silicon regions and said metal silicides.

2. The semiconductor structure of claim 1, wherein each hydrogenated crystalline silicon region contains a p-type dopant.

3. The semiconductor structure of claim 1, wherein each hydrogenated crystalline silicon region contains an n-type dopant.

4. The semiconductor structure of claim 1, wherein each hydrogenated crystalline silicon region has a hydrogen content of from 5 atomic percent to 40 atomic percent.

5. The semiconductor structure of claim 1, wherein each hydrogenated crystalline silicon region is spaced apart from a sidewall of said middle-of-the-line dielectric material.

6. The semiconductor structure of claim 1, wherein each hydrogenated crystalline silicon region has a uniform hydrogen content.

7. The semiconductor structure of claim 1, wherein each hydrogenated crystalline silicon region has a graded hydrogen content.

8. The semiconductor structure of claim 7, wherein said hydrogen content in each of said wherein each hydrogenated crystalline silicon region is greatest at an interface with said channel material.

9. The semiconductor structure of claim 1, wherein each hydrogenated crystalline silicon region further includes one element selected from the group consisting of deuterium, fluorine, chlorine, carbon, germanium, oxygen and nitrogen.

10. A semiconductor structure comprising:
    a functional gate structure located on a channel material composed of germanium or a germanium tin alloy;
    a middle-of-the-line dielectric material surrounding said functional gate structure and having a topmost surface that is coplanar with a topmost surface of said functional gate structure, said middle-of-line dielectric material comprises contact openings located on both sides of said functional gate structure;
    a hydrogenated crystalline silicon region located on an exposed surface of said channel material layer and in each contact opening, wherein an entirety of said hydrogenated crystalline silicon region is located above a topmost surface of said channel material; and
    a contact structure located on a surface of said hydrogenated crystalline silicon region and in each contact opening, wherein said contact structure comprises a metal silicide located on a topmost surface of said hydrogenated crystalline silicon region and a contact metal located on said metal silicide, wherein a diffusion barrier liner composed of a metal or metal nitride is positioned between said metal silicide and said contact metal and is in direct physical contact with sidewalls of said hydrogenated crystalline silicon regions and said metal silicides.

11. A semiconductor structure comprising:

a functional gate structure located on a channel material composed of a germanium tin alloy;

a middle-of-the-line dielectric material surrounding said functional gate structure and having a topmost surface that is coplanar with a topmost surface of said functional gate structure, said middle-of-line dielectric material comprises contact openings located on both sides of said functional gate structure;

a hydrogenated crystalline silicon region located on an exposed surface of said channel material layer and in each contact opening; and a contact structure located on a surface of said hydrogenated crystalline silicon region and in each contact opening, wherein said contact structure comprises a metal silicide located on a topmost surface of said hydrogenated crystalline silicon region and a contact metal located on said metal silicide, wherein a diffusion barrier liner composed of a metal or metal nitride is positioned between said metal silicide and said contact metal and is in direct physical contact with sidewalls of said hydrogenated crystalline silicon regions and said metal silicides.

12. The semiconductor structure of claim 11, wherein said germanium tin alloy has a tin content from 0.1 atomic percent to 100 atomic percent.

* * * * *